United States Patent [19]
Hoshi

[11] Patent Number: 5,113,132
[45] Date of Patent: May 12, 1992

[54] PROBING METHOD

[75] Inventor: Seiichi Hoshi, Kofu, Japan

[73] Assignee: Tokyo Electron Limited, Tokyo, Japan

[21] Appl. No.: 687,553

[22] Filed: Apr. 19, 1991

[30] Foreign Application Priority Data

May 17, 1990 [JP] Japan .................................. 2-127584

[51] Int. Cl.⁵ .............................................. G01R 31/02
[52] U.S. Cl. ........................... 324/158 F; 324/158 P; 324/158 R
[58] Field of Search ............ 324/158 F, 158 R, 158 P, 324/72.5, 73.1; 437/8

[56] References Cited

U.S. PATENT DOCUMENTS

4,565,966 1/1986 Burr et al. ...................... 324/158 F
4,943,767 7/1990 Yokota ............................ 324/158 P

FOREIGN PATENT DOCUMENTS

63-129640 6/1988 Japan ............................. 324/158 F

*Primary Examiner*—Ernest F. Karlsen
*Attorney, Agent, or Firm*—Oblon, Spivak, McClelland, Maier & Neustadt

[57] ABSTRACT

The electric characteristic of each of semiconductor chips formed on a semiconductor wafer substrate is measured while keeping probes contacted with electrode pads of the semiconductor chip. The wafer is mounted on a mount movable in directions X, Y, Z and θ. The array direction of the semiconductor chips on the wafer is positioned in the directions X and Y, in which the mount is moved, at an alignment position and the electrode pads of each of the chips are positioned relative to their corresponding probes at a measuring position. Information needed to carry out the positioning at the alignment position is stored as a first data and information needed to carry out the positioning at the measuring position is stored as a second data. The following three steps can be selectively conducted after the positioning at the measuring position. Measurement is conducted relative to the substrate at a first step. The positionings at the alignment and measuring positions are again automatically conducted relative to the substrate at a second step in response to the first and second data stored. The positionings at the alignment and measuring positions are again conducted relative to the substrate while storing first and second new data resulted from these re-positionings at a third step.

8 Claims, 5 Drawing Sheets

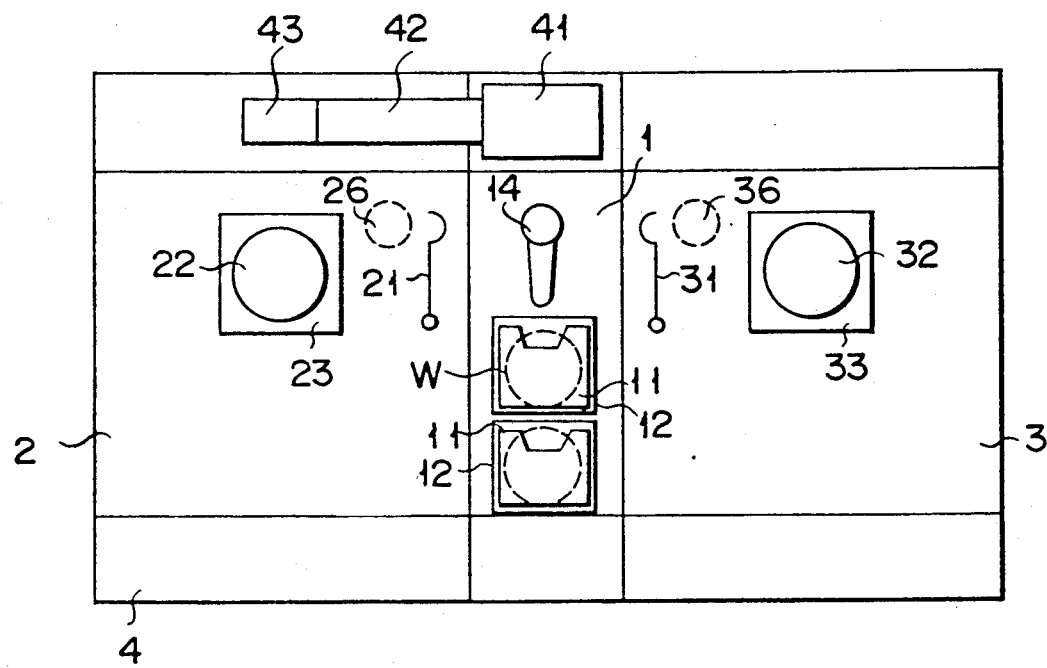
F I G. 1
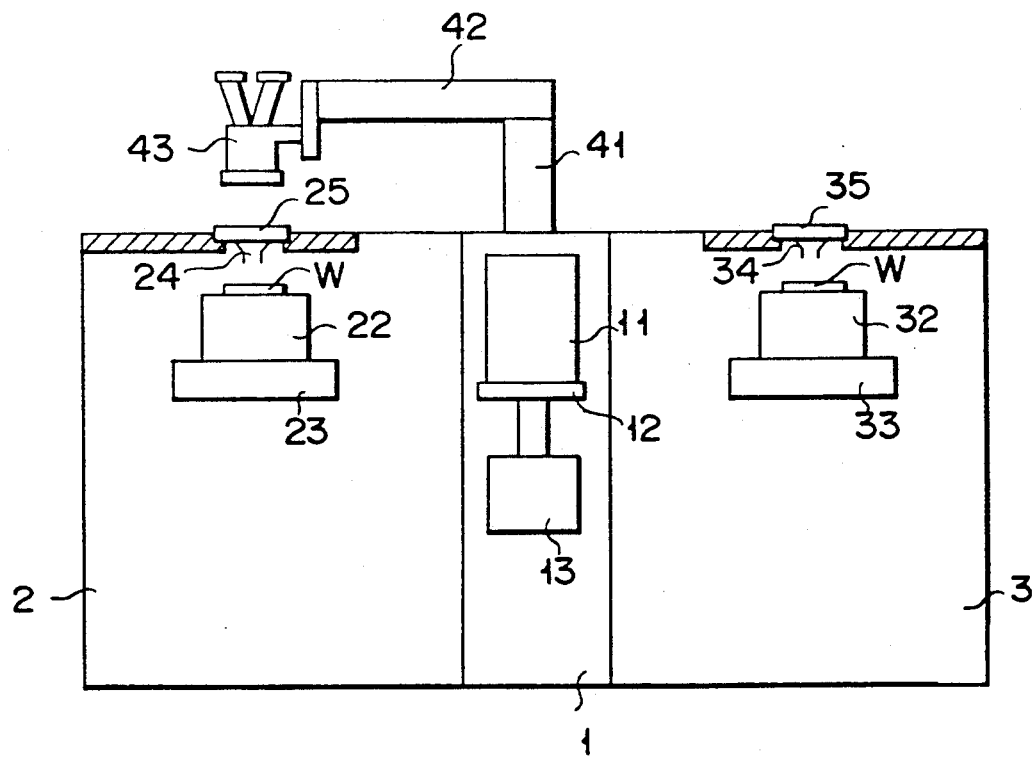
F I G. 2

PROBING METHOD

BACKGROUND OF THE INVENTION

1. Field of the Invention

The present invention relates to a method of probing circuit devices such as the integrated circuits formed on a semiconductor wafer.

2. Description of the Related Art

Probing is one of those methods which are intended to measure the electric characteristic of each of devices such as ICs in the course of manufacturing these devices. This probing is carried out in such a way that each of matters to be measured, that is, each of semiconductor devices or chips pattern-formed on a semiconductor wafer is electrically connected to the tester which comprises measuring instruments and the like by probes of the probe device to measure the electric characteristic of the semiconductor chip.

Before this measurement is carried out, however, positioning is needed to accurately contact the probes with electrode pads of each of the semiconductor chips on the wafer. As a step previous to this measurement, therefore, the operator carries out the positioning operation relative to a first wafer, which is called a teaching process. Data obtained by the positioning operation are stored and then used to automatically carry out the positioning of wafers which will follow before the measurement is applied to each of the wafers.

Conventionally, the operator starts measuring each of the following wafers just after the data are obtained while positioning the first wafer.

When each of the following wafers is measured using the data obtained in the course of operator's positioning the first wafer, however, it sometimes happens that the measuring probes are not accurately positioned relative to the electrode pads of each of the semiconductor chips formed on the wafer. The conventional positioning manner, however, has no measure for confirming how the probes are positioned relative to the electrode pads of each of the semiconductor chips on the wafer. This therefore forces the operator to again repeat the positioning operation relative to the second wafer, namely the teaching process by his hands.

SUMMARY OF THE INVENTION

The present invention is therefore intended to eliminate the above-mentioned drawback and to make it possible to confirm the positioning of wafers conducted by the operator before measurement relative to each of the semiconductor chips on the wafer is started.

According to the present invention, there can be provided a probing method of measuring the electric characteristics of an object to be measured, while keeping measuring probes contacted with electrode pads of each of the objects arranged on a substrate comprising the steps of, mounting the substrate on a mount rotatable and movable in directions X and Y which are perpendicular to each other on a plane, moving the substrate-mounted mount to an alignment position, positioning the mount at the alignment position to align the directions X and Y in which the mount is moved with the array direction of the objects on the substrate, storing, as first data, information needed to carry out the positioning at the alignment position, moving the substrate-mounted mount to measuring position where the measuring probes are arranged, positioning the mount at the measuring position to align the electrode pads of each of the objects with their corresponding measuring probes, and storing, as second data, information needed to conduct the positioning at the measuring position, said probing method further selectively including, after the positioning at the measuring position, a first step of carrying out measurement relative to the substrate, a second step of again automatically conducting the positionings of the substrate at the alignment and measuring positions in response to the first and second data stored, and a third step of again conducting the positionings of the substrate at the alignment and measuring positions and storing first and second new data resulted from these repositionings at the alignment and measuring positions.

According to the present invention, the mount is returned to the alignment position when the operator conducts some predetermined operations after the positioning operation relative to a first object such as a wafer is carried out by the operator. The mount is then again moved to the measuring position in response to the data obtained when the positioning operation relative to the first wafer is conducted by the operator. When the positioning of wafer, that is, the positioning of the electrode pads of each of the semiconductor chips on the wafer relative to the probes is confirmed at this measuring position, therefore, it can be confirmed whether or not the automatic positioning in response to the data obtained when the positioning operation is conducted by the operator is accurate and whether or not the electrode pads of each of the semiconductor chips on the wafer are accurately aligned with the probes.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 1 is a top view showing the probe apparatus to which a probing method of the present invention is applied;

FIG. 2 is a side view showing the probe apparatus in FIG. 1

DETAILED DESCRIPTION OF THE PREFERRED EMBODIMENT

Figure 3:
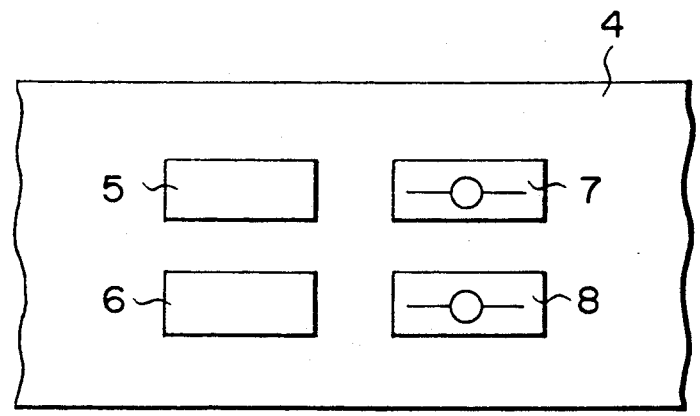
FIG. 3 is a plan view showing switches on the operation panel.

The wafers probing apparatus has a center loader section 1 and plural stages, i.e., a first measuring stage 2 located o the left of the loader section 1 and a second measuring stage 3 on the right of it, as shown in FIG. 1, to carry out measurements efficiently.

Two wafer cassettes 11 are housed in the loader section 1. These wafer cassettes 11 are mounted on tables 12, respectively, and each of these tables 12 is moved up and down by a motor 13. A pincette 14 are located corresponding to the wafer cassette 11 and it picks up each of wafers W which has been held in the wafer cassette 11 at a predetermined position out of the cassette 11 or put each of the wafers into the cassette 11 at a predetermined position.

The first and second measuring stages 2 and 3 are independently constructed from the loader section 1 so that physical influence, such as vibration, can not be transmitted from the latter. The first and second measuring stages 2 and 3 are same in arrangement and they have swing arms 21 and 31 which serve to receive the wafers W from the loader section 1 and transfer them to the loader section 1, and mounts 22 and 32 on which the wafers W are mounted. The wafer-mounted mounts 22 and 32 temporarily fix the wafers thereon by vacuum absorption, for example. Further, the mounts 22 and 32 can be moved by X-Y stages 23 and 33 in two directions X and Y which are perpendicular to each other on the horizontal plane, from positions 26 and 36, where they receive the wafers W from and transfer them to the loader section 1 shown in FIG. 1, to fine alignment and measuring positions (not shown), while they can be moved in the vertical direction Z and rotated in a direction $\theta$.

Probe cards 25 and 35 each having a row of probes 24 or 34 which are contacted with electrode pads of one of semiconductor chips on the wafer W are located at the measuring positions of the stages 2 and 3.

A support rod 41 is projected upward from the top of the loader section 1 at the rear thereof and a swingable arm 42 is attached to the top of the support rod 41 to swing round the support rod 41 and left and right from the center of the loader section 1 by an angle of 50°. A microscope 43 through which semiconductor chips of the wafer W and the probes 24 or 34 of the cards can be viewed in enlarged scale to carry out a alignment described later is attached to the front end of the arm 42. This microscope 43 can be moved up and down in the vertical direction and used commonly at both of the measuring stages 2 and 3. A ITV camera may be used instead of the micro scope 43.

An operation panel 4 is arranged on the front top of the case of the probe apparatus and a switch means for the measuring stages 2 and 3 comprising start and correction switches 5 and 6 which are of the push type and setup and run switches 7 and 8 which are of the selective toggle type, as shown in FIG. 3, is arranged on the operation panel 4. Top surfaces of the switches 5–8 are made different from one another in touch feeling by finger to prevent any of them from being wrongly operated.

Although not shown, CPUs are housed in the loader section 1 and the first and second measuring stages 2 and 3 to carry out various kinds of controls when the wafers W are positioned and measured.

Figure 5A:
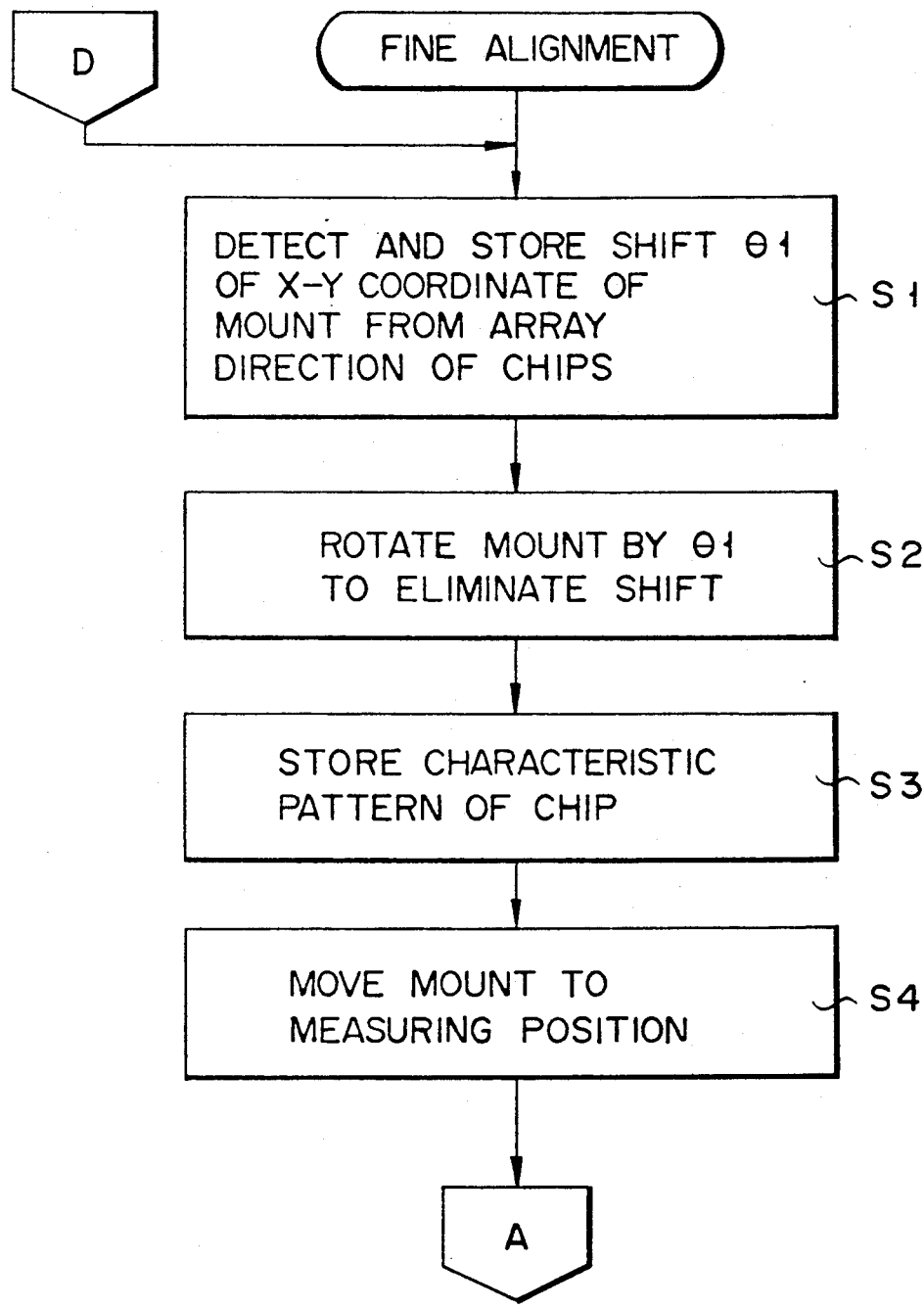
FIGS. 5A through 5C are flow charts intended to explain main steps of the present invention.
Figure 5B:
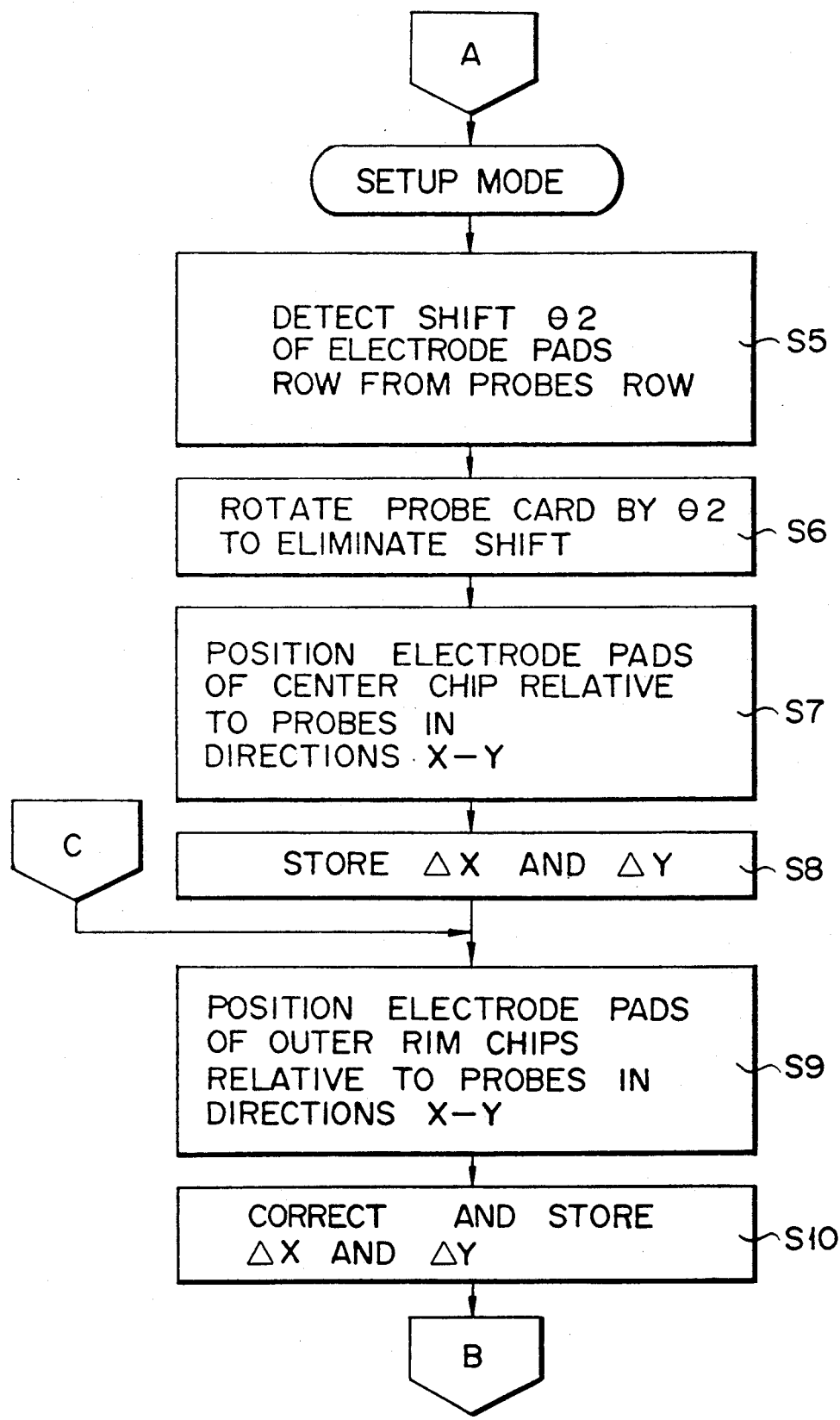
Figure 5C:
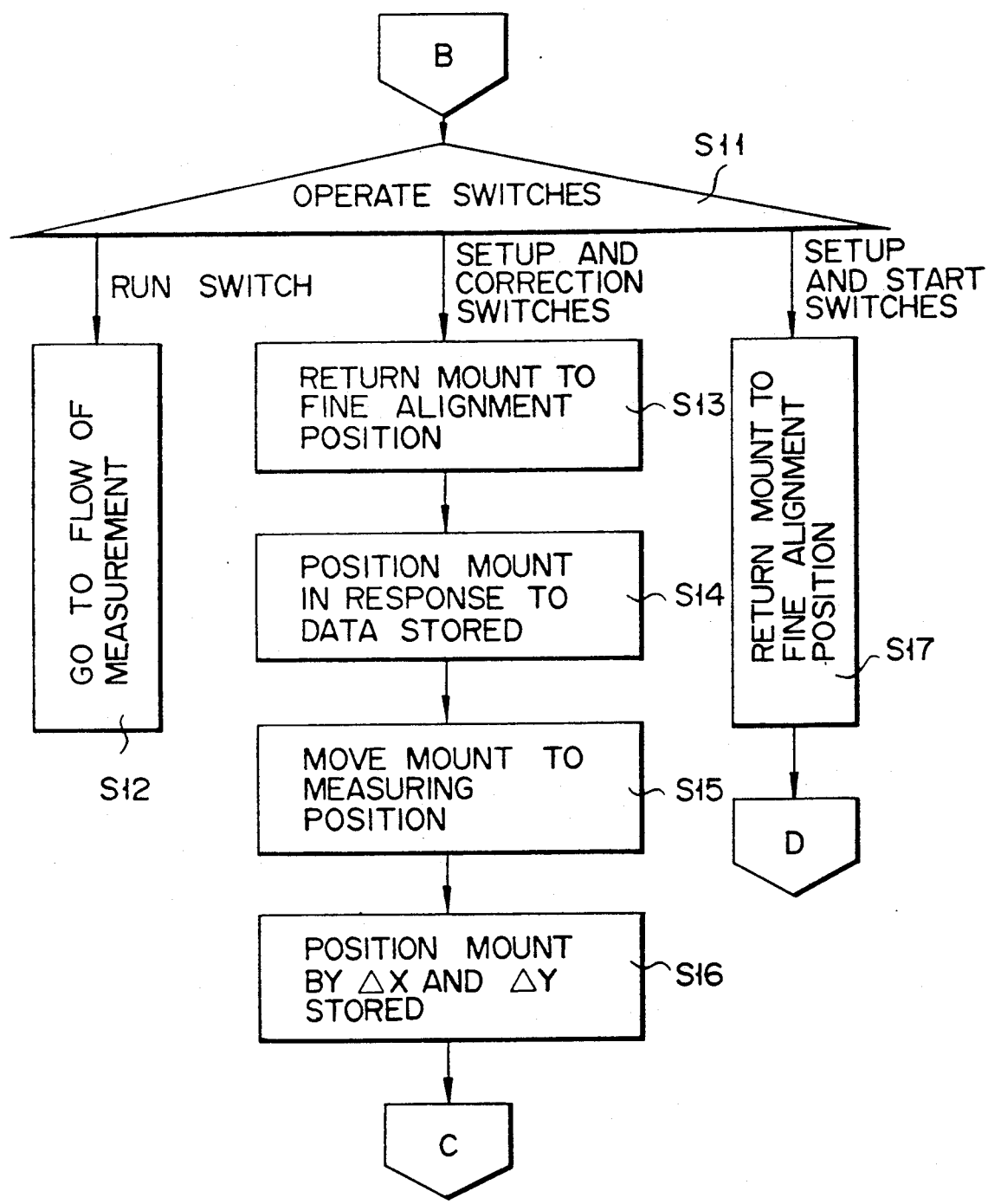

The wafer positioning operation which is carried out by the operator, using the above-described probe apparatus, will be described referring to FIGS. 5A–5C. Description will be made about the operation carried out only at the first measuring stage 2 but, needless to say, the same operation will be carried out also at the second measuring stage 3.

The wafer W is picked up out of the cassette 11 by the pincette 14 and it is pre-aligned on the basis of its orientation flat. The pre-alignment may be carried out by rotating the wafer W by a roller member and mechanically or optically detecting the orientation flat. It is then mounted on the mount 22 by the swing arm 21. Its positioning has been almost finished by the pre-alignment but it must be more accurately aligned because each of the electrode pads of each of the semiconductor chips on it are ultra-small in size.

The mount 22 is then moved to the fine alignment position (not shown) by the X-Y stage 23 for this purpose. A TV camera (not shown) is located above the fine alignment position and the surface of the wafer W is output as a image pattern of electrical signal on the TV camera. It is detected from the image data of the image pattern and then stored how the mount 22 moved in the directions X and Y is shifted from the array direction (or direction of scribe line) of the semiconductor chips on the wafer W (Step S1). The mount 22 is then rotated in a direction $\theta 1$ to eliminate this shift, so that the array direction of the semiconductor chips on the wafer W can be matched the coordinate system X-Y of the moved mount 22 (Step S2).

A characteristic pattern of one of the semiconductor chips on the wafer is detected and stored (Step S3). The characteristic pattern is part of the chip, such as a testing mark or the scribe line, which is predetermined. This characteristic pattern is controlled to become a positional reference in the directions X and Y and the position of this characteristic pattern is aligned with each of predetermined positions as follows.

The mount 22 is moved only by a predetermined distance D by the X-Y stage 23 to move the wafer W on it to the measuring position just under the probe card 25 (Step S4).

Figure 4:
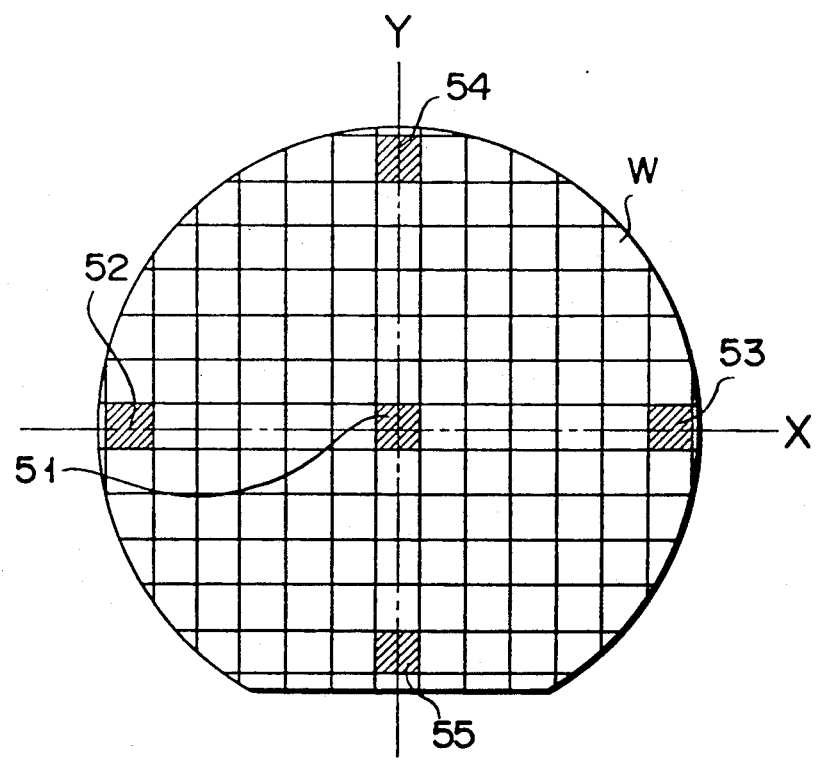
FIG. 4 is a plan view showing the top of a wafer to explain the operation of setting up the wafer.

The setup operation is carried out at the measuring position. More specifically, another shift $\theta 2$ between the arrangement direction of probes 24 of the probe card 25 and that of electrode pads of a semiconductor chip 51 on the wafer in the center thereof as shown in FIG. 4 is detected by the microscope 43 (Step S5). The probe card 25 is rotated by $\theta 2$ to correct this shift of one arrangement direction relative to the other (Step S6).

After the correction is finished, the mount 22 is positioned in the directions X and Y to accurately contact the probes 2 with their corresponding electrode pads of the semiconductor chip 51 in the center of the wafer W (Step S7). Distances $\Delta x$ and $\Delta y$ in the directions X and Y, which is needed this time to align the wafer W on the mount 22 with the probe card 2S, relative to the predetermined distance D are stored as positioning data (Step S8).

Semiconductor chips 52, 53, 54 and 55 located along the outer rim of the wafer W as shown in FIG. 4 are successively moved to correspond to the probe card 25 every time when the start switch 5 is pushed, and further positioning of the wafer in the directions X and Y is conducted using the peripheral semiconductor chips 52 and 55 (Step S9) and the distance $\Delta x$ and $\Delta y$ are corrected if necessary (Step S10). When each of the following wafers which will be brought here to the measuring position is correctly moved by the distances $\Delta x$ and $\Delta y$ after it is finely aligned at the fine alignment position and then moved from the fine alignment position by the distance D, therefore, the row of the electrode pads of each of the semiconductor chips on the wafer can be aligned with that of the probes 24 of the probe card 25.

When the operator brings the run switch 8 down after check is finished relating to the final peripheral chip 55 under the state that the wafer W is set up (Step S11), measuring mode is started (Step S12).

When the correction switch 6 is pushed while bringing not the run switch 8 but the setup switch 7 down (Step S11), however, the mount 22 is returned to the fine alignment position (Step S13). The mount 22 is rotated by $\theta 1$ in response to the information stored and the array direction of the semiconductor chips on the wafer is automatically aligned with the coordinate system X-Y of the moved mount 22 (Step S14).

The mount 22 is again moved to the measuring position only by the distance D (Step S15) and further moved by the correction distances $\Delta x$ and $\Delta y$ stored (Step S16). The positioning of the electrode pads row of the semiconductor chip 51 in the center of wafer relative to the probes row of the probe card ca be confirmed by the microscope 43.

Further positioning of the electrode pads row relative to the probes row can be successively confirmed, relating to the semiconductor chips 51-55, every time when the operator pushes the start switch 5 (Steps S9 and S10). In short, the positioning of them can be confirmed under the state that the wafer is set up.

When the operator pushes the start switch 5 while bringing the setup switch 7 down (Step S11), the mount 22 is returned to the fine alignment position (Step S17), as seen in the case where the correction switch 6 is pushed. An accurate re-positioning of the semiconductor chips on the wafer is conducted and data such as the angle $\theta 1$ by which the mount 22 is rotated and the characteristic pattern of a chip needed to conduct this re-positioning are retaken and matters stored are rewritten (Steps S1-3).

The mount 22 is then moved only by the distance D and to the measuring position (Step S4). The positioning relating to the semiconductor chips 51-55 is carried out while re-taking data such as the correction distances $\Delta x$ and $\Delta y$ and, if necessary, correcting the shift of the probe card in its rotation direction (Steps S5-10). The re-alignment can be thus conducted and the positioning resulted from this re-alignment can be confirmed.

Although the present invention has been applied to the wafer probers in the above-described case, it can be applied to the device probers and other prober devices.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A probing method of measuring the electric characteristic of an object to be measured, while keeping measuring probes contacted with electrode pads of each of the objects arranged on a substrate comprising the steps of:

mounting the substrate on a mount rotatable and movable in directions X and Y which are perpendicular to each other on a plane;

moving the substrate-mounted mount to an alignment position;

positioning the mount at the alignment position to align the directions X and Y in which the mount is moved with the array direction of the objects on the substrate;

storing, as first data, information needed to carry out the positioning at the alignment position;

moving the substrate-mounted mount to a measuring position where the measuring probes are arranged;

positioning the mount at the measuring position to align the electrode pads of each of the objects with their corresponding measuring probes; and storing, as second data, information needed to conduct the positioning at the measuring position;

said probing method further selectively including, after the positioning at the measuring position, a first step of carrying out measurement relative to the substrate;

a second step of again automatically conducting the positionings of the substrate at the alignment and measuring positions in response to the first and second data stored; and a third step of again conducting the positionings of the substrate at the alignment and measuring positions and storing first and second new data resulted from these re-positionings at the alignment and measuring positions.

2. The probing method according to claim 1, whereby the positioning at the alignment position includes a step of adjusting the position of the objects on the substrate by rotating the mount.

3. The probing method according to claim 1, whereby the positioning at the measuring position includes a step of adjusting the position of the electrode pads of each of the objects on the substrate by moving the mount in the directions X and Y.

4. The probing method according to claim 1, whereby the positioning at the measuring position is applied to the plural objects selected.

5. The probing method according to claim 4, whereby the automatic positioning of the second step at the measuring position is applied to a first one of the plural objects selected.

6. The probing method according to claim 4, whereby the plural objects are selected from those which are located in the center and along the outer rim of the substrate.

7. The probing method according to claim 5, whereby the first objects is one located in the center of the substrate.

8. The probing method according to claim 1, whereby the substrate is a semiconductor wafer and the objects to be measured are semiconductor chips.

* * * * *